United States Patent [19]

Horne et al.

[11] 4,130,897

[45] Dec. 19, 1978

[54] MNOS FET MEMORY RETENTION CHARACTERIZATION TEST CIRCUIT WITH ENHANCED SENSITIVITY AND POWER CONSERVATION

[75] Inventors: Merton A. Horne, Eagan; Bruce A. Brillhart, Minneapolis, both of Minn.

[73] Assignee: Sperry Rand Corporation, New York, N.Y.

[21] Appl. No.: 821,271

[22] Filed: Aug. 3, 1977

[51] Int. Cl.$^2$ .................. G11C 11/40; G11C 7/00
[52] U.S. Cl. .................... 365/205; 307/279; 307/DIG. 3; 307/DIG. 4; 365/184; 365/227
[58] Field of Search .......... 365/227, 205, 201, 154, 365/184, 185; 307/238, 279, DIG. 3, DIG. 4

[56] References Cited

U.S. PATENT DOCUMENTS

| | | | |
|---|---|---|---|
| 3,579,204 | 5/1971 | Lincoln | 307/279 |
| 3,838,295 | 9/1974 | Lindell | 307/238 |
| 3,976,895 | 8/1976 | Koo | 307/279 |
| 3,987,315 | 10/1976 | Matsue | 307/DIG. 4 |
| 3,993,919 | 11/1976 | Cox et al. | 307/DIG. 3 |
| 4,027,176 | 5/1977 | Heuber et al. | 307/DIG. 3 |
| 4,039,861 | 8/1977 | Heller et al. | 307/DIG. 3 |

*Primary Examiner*—Bernard Konick
*Assistant Examiner*—Donald McElheny
*Attorney, Agent, or Firm*—Douglas L. Tschida; Kenneth T. Grace; Marshall M. Truex

[57] ABSTRACT

An improved sense latch circuit for differentially sensing an MNOS memory FET's voltage thresholds, selectively operable in either a memory retention or read interrogation mode with enhanced sensitivity and improved power conservation. The improvement consisting of the additional cross coupling of each of the latch outputs to a respective plurality of MOS FETs coupled in series with each of the MNOS FET inputs, which cross coupling reduces extraneous current paths and increases the switching sensitivity of the sense latch circuit.

7 Claims, 5 Drawing Figures

MNOS FET MEMORY RETENTION CHARACTERIZATION TEST CIRCUIT WITH ENHANCED SENSITIVITY AND POWER CONSERVATION

COPENDING APPLICATION

The subject invention is related to the copending application Ser. No. 821,272 of Merton A. Horne and Thomas A. Pogemiller filed of even-date, entitled MNOS FET Memory Retention Characterization Test Circuit.

BACKGROUND OF THE INVENTION

The sense latch circuitry of the above referred to copending application and of the pending application of Robert J. Lodi, Ser. No. 736,551 filed Oct. 28, 1976, now abandoned, operate in response to the differential inputs from MNOS FET memory cells. The differential inputs are cross coupled in a bistable latching arrangement such that the latch produces outputs corresponding to binary data stored in the memory cells.

Due to the inherent nature of the MNOS FET, the reading of binary data stored in MNOS FET memory cells is dependent on the retention time of the individual MNOS FETs which comprise each cell. The retention time is further dependent on the magnitude and duration of the write signal, the read cycle time and the amount of read disturb, which all affect the number of reads that are possible before the separation between the MNOS FET's threshold levels become indistinguishable. It is therefore desirable that the sense latch, which senses the threshold separation, be sensitive enough to detect the separation for as many read operations as possible before the separation becomes indistinguishable.

SUMMARY OF THE INVENTION

The present invention teaches an improved sense latch circuit wherein the outputs of the cross coupled sense latch are each further cross coupled to a respective plurality of MOS FETs which are coupled in series with the MNOS FET input to the latch circuit. The additional cross coupling isolates one of the MNOS FET inputs when the latch switches during each read operation and thereby reduces extraneous current paths and increases the switching separation of the latch outputs.

DESCRIPTION OF THE PREFERRED EMBODIMENT

Figure 1:
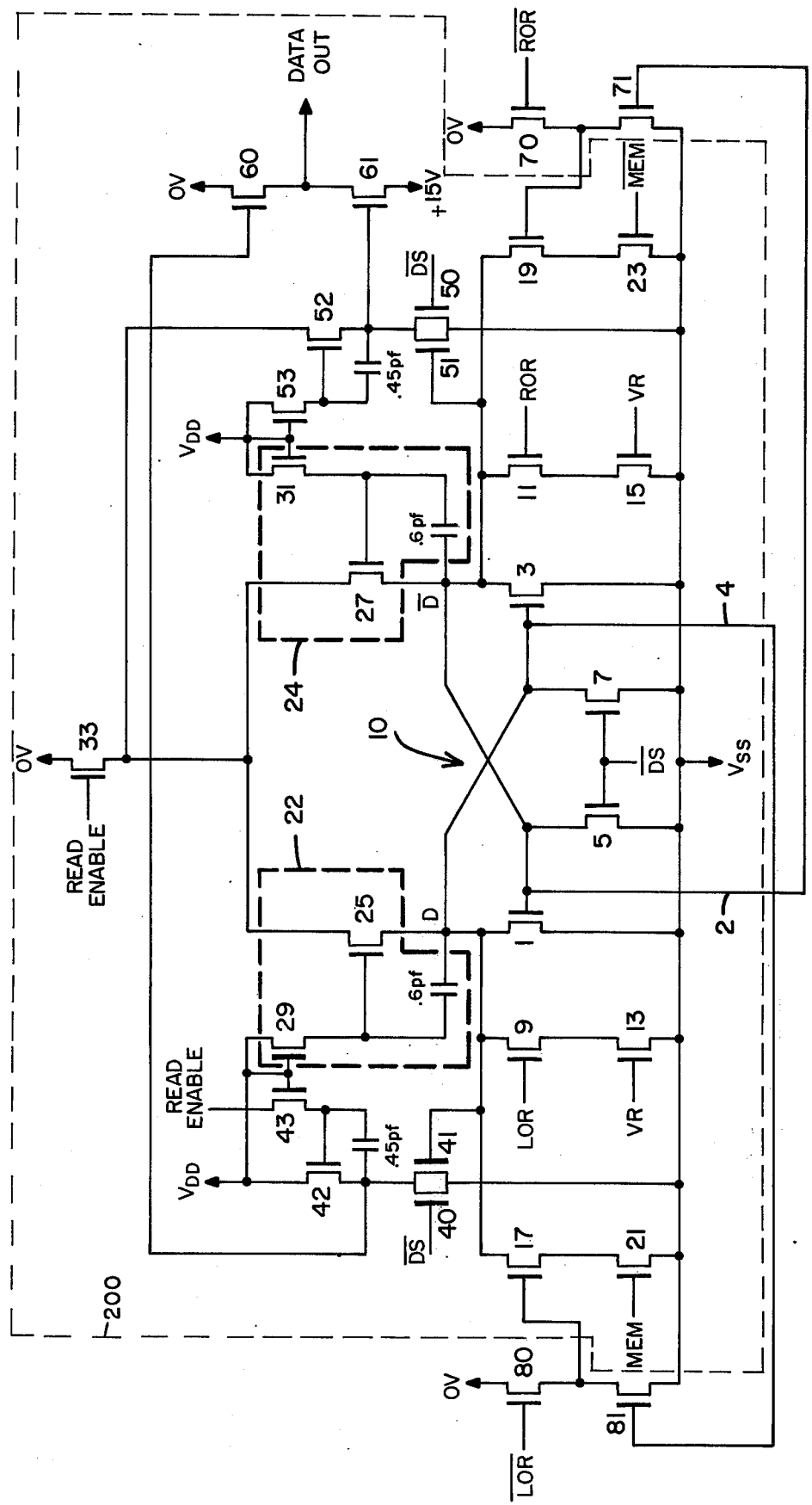
FIG. 1 is a schematic of the improved sense latch circuit with data buffering and the additional cross coupling of the latch outputs.

Referring to FIG. 1 an improved bistable sense latch circuit selectively operable for interrogating the binary data stored within a semiconductor memory array comprised of variable threshold transistors such as MNOS FET's or the individual analog voltage threshold levels of the MNOS FETs of the array is shown.

The operation of the prior art sense latch 200 is described more fully in the copending application Ser. No. 821,272 of Merton A. Horne and Thomas A. Pogemiller, entitled MNOS FET Memory Retention Characterization Test Circuit. The improved sense latch circuit of FIG. 1, the left-right override select circuit 12 of FIG. 3 and the associated MNOS FET memory array are responsively coupled to the signals and read cycle timing sequence of FIG. 2 for operating the sense latch in its respective modes of operation.

Figure 5:
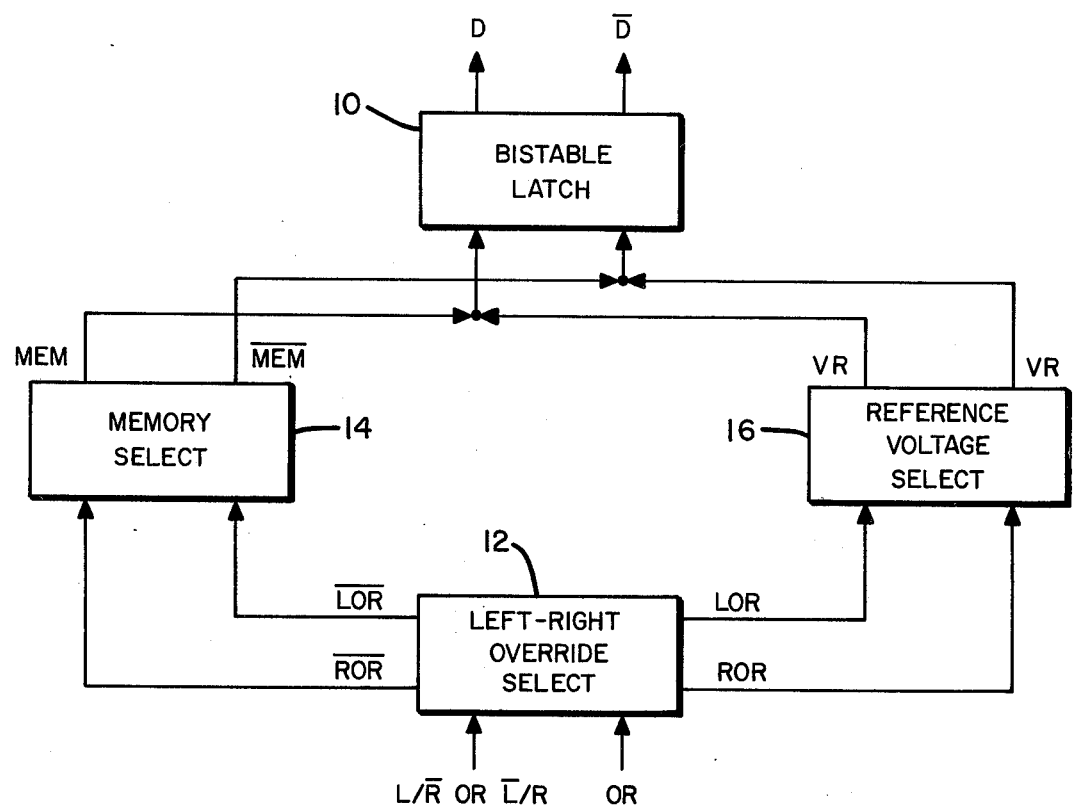
FIG. 5 is a block diagram of the modes of operation of the sense latch circuit of FIG. 1.

Referring to the block diagram of FIG. 5 the modes of operation are as follows. The memory retention interrogation mode is initiated with the application of an override signal OR and either a left select L/$\overline{R}$ or a right select $\overline{L}$/R signal to the left-right override select circuit 12 where the appropriate left override select LOR and right override select ROR interrogation signals and their complements $\overline{LOR}$, $\overline{ROR}$ are generated. Depending upon the selection signals, the complement left override signal $\overline{LOR}$ or complement right override signal $\overline{ROR}$ will select one of the MNOS FETs of the addressed memory cell for interrogation. The memory select circuitry 14 is responsively coupled to $\overline{LOR}$ and $\overline{ROR}$ to couple one of the MNOS FET outputs, either MEM or $\overline{MEM}$, to one side of the bistable latch 10. At the same time LOR and ROR are coupled to the reference voltage select circuitry 16 to responsively couple a reference voltage VR to the other side of the bistable latch 10. This coupling of VR and the output of an MNOS FET to opposite sides of a bistable latch 10, permits the analog comparison of the two signals for sensing the specific analog voltage threshold of the MNOS FET being interrogated.

During the read interrogation mode, the left-right override select circuit 12 isolates the reference voltage select circuitry 16 via LOR and ROR and couples MEM and $\overline{MEM}$ to opposite sides of bistable latch 10 via $\overline{ROR}$, $\overline{LOR}$ and the memory select circuitry 14. The latch 10 responds to the differential inputs to produce latch outputs which correspond to the binary data stored within the addressed memory cell.

The sense latch and left-right override select 12 circuitry of the present invention can be fabricated as an integrated circuit. The typical width-to-length ratios of the MOS FETs when fabricated as an integrated circuit are set forth in the following table:

| WIDTH/LENGTH RATIOS OF MOS FET's | |
|---|---|
| MOS FET | W/L |
| 1, 3, 9, 11, 13, 15, 17, 19, 21 23, 94, 95, 97, 101, 105, 107 | 3/1 |
| 5, 7 | 6.5/1 |
| 25, 27 | 1/1.9 |
| 29, 31, 43, 53, 90, 93, 96, 100, 103, 106 | 1/1.25 |
| 42, 52 | 1/3.1 |
| 40, 50 | 2.5/1 |
| 41, 51 | 4.5/1 |
| 61 | 7.5/1 |
| 33, 60 | 10/1 |
| 92, 102 | 1/3.8 |
| 91, 104 | 8/1 |

Figure 2:
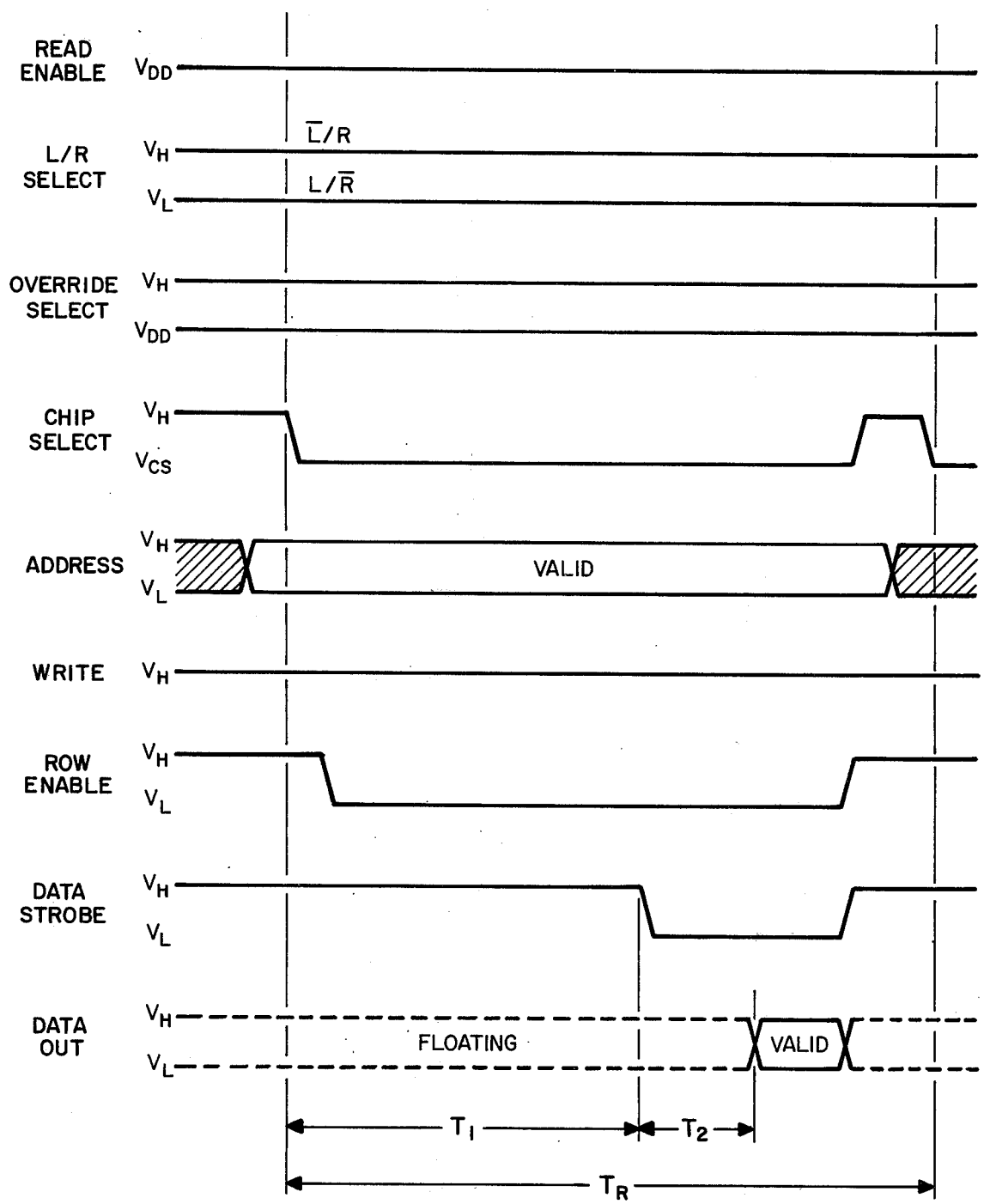
FIG. 2 is a diagram of the read cycle timing sequence for operating the sense latch circuit of FIG. 1 and the left-right override select circuit of FIG. 3.

Referring to FIGS. 1 and 2 the sense latch 200 in either of its modes of operation is enabled by a read enable signal, corresponding to $V_{DD}$ and typically a $-15$ volts, which is impressed on the gate of MOS FET 33 causing MOS FET 33 to turn "on" and also on the drain of MOS FET 43. The voltage $V_{DD}$, is further impressed on the drain of MOS FET 42, the gate of MOS FET 43 and the common gate-drain connection of MOS FETS 29, 31 and 53, causing MOS FETs 29, 31 and 53 to turn "on" and act in a resistive manner.

Upon the application of the complement data strobe signal $\overline{DS}$, corresponding to $V_L$ and typically 0 volts, during time $T_1$ to the gates of MOS FETs 40, 50, 5 and 7, the respective MOS FETs turn "on", MOS FETs 5 and 7 cause the latch 10 output nodes D and $\overline{D}$ to charge towards the voltage level $V_{SS}$, typically a +15 volts; and MOS FETs 40 and 50 set the tristate data out node in a floating condition. This precharging of the latch 10 nodes D and $\overline{D}$ prepares the latch 10 for the subsequent differential sensing between the MNOS FET outputs MEM and $\overline{MEM}$, during the read interrogation mode or between the voltage reference VR and MEM or $\overline{MEM}$ during the memory retention interrogation mode.

Figure 3:
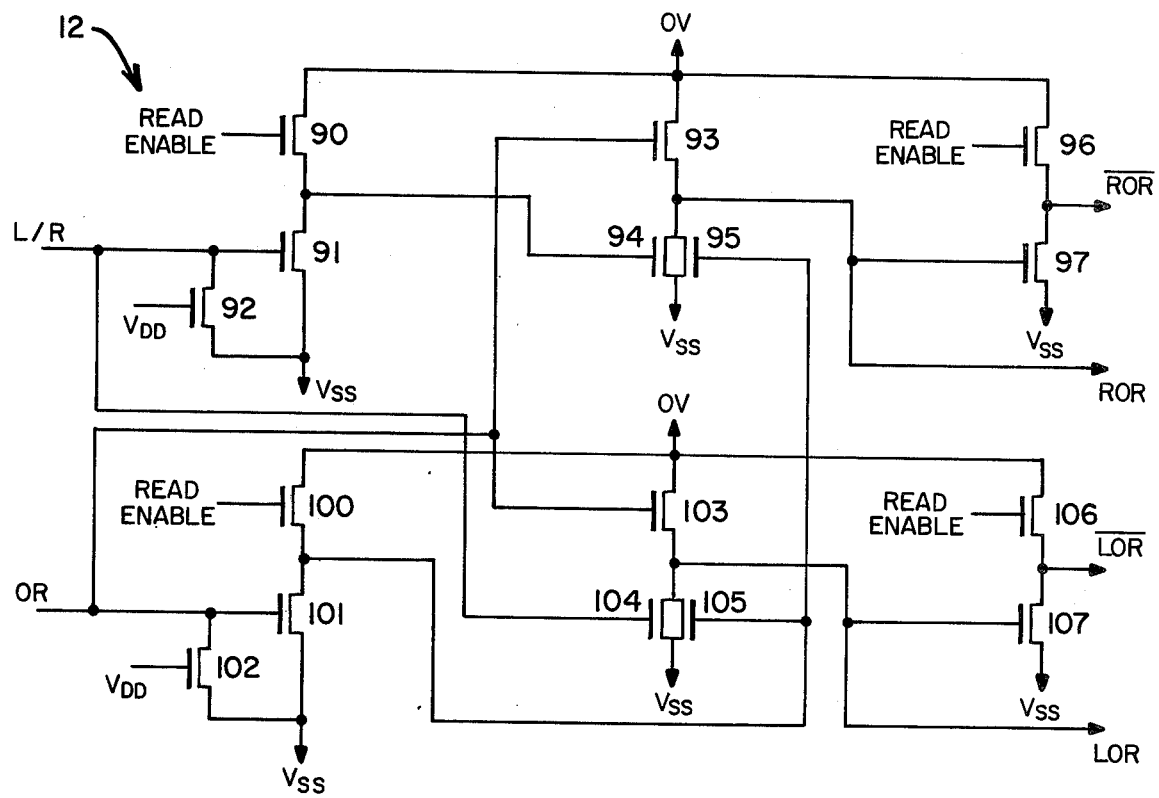
FIG. 3 is a schematic of the left-right override select circuit.

During the memory retention interrogation mode the left/right override circuit 12 of FIG. 3, responsively couples the right override ROR and left override LOR signals and their complements $\overline{ROR}$ and $\overline{LOR}$ to the gates of MOS FETs 11, 9, 70, and 80 of FIG. 1. In this manner the latch 10 is selectively coupled to VR and the individual MNOS FET outputs MEM and $\overline{MEM}$ to permit the individual interrogation of the analog voltage thresholds of the MNOS FETs.

During the read interrogation mode the left/right override select circuitry isolates the VR inputs, by turning "off" MOS FETs 9 and 11 so that the latch 10 senses and responds to only the differential inputs MEM and $\overline{MEM}$, to produce latch outputs corresponding to the binary data stored within the memory cells.

During time $T_2$, $\overline{DS}$ switches to $V_H$, typically a +15 volts, which causes MOS FETs 5 and 7 to turn "off". The latch 10 responding to the differential inputs MEM and $\overline{MEM}$, impressed on the gates of MOS FETs 21 and 23 in the read interrogate mode, and MEM or $\overline{MEM}$ and VR, impressed on the selected gates of MOS FETs 21, 23, 13 and 15 in the memory retention interrogation mode, cause the respective MOS FETs to conduct and establish conduction paths between $V_{SS}$ and the OV source connected to the drain of the "on" MOS FET 33. Depending upon the conduction of the selectively coupled MOS FETs, which are further dependent on the levels of the signals impressed on their gates, the nodes D and $\overline{D}$ will fall from the precharged level at different rates until the MOS FETs 1 and 3 switch and establish the latch outputs on the nodes D and D in the high and low stable states. The rate of fall will be dependent upon the switching of the boostrap circuits 22 and 24, comprised of MOS FETs 29 and 25, 31 and 27 and their respective 0.6 picofarad capacitors. The voltage levels of the stable states will reflect any intervening voltage drops between the ideal OV and +15 volt maximum separation levels, which are coupled to the bistable latch 10.

The switching action of the sense latch 200 is improved by the additional cross coupling of the nodes D and $\overline{D}$ via conductors 2 and 4, to the gates of MOS FETS 71 and 81 in a cross coupled manner causing either MOS FET 71 or 81 to turn "on" and the other to turn "off". Assuming MOS FET 71 turns "on" as $\overline{D}$ falls towards OV, $V_{SS}$ connected to the source of MOS FET 71 is coupled to the common source-drain connection of the "on" MOS FETs 70 and 71 and due to the differing conductance levels of MOS FETs 70 and 71, $V_{SS}$ is impressed upon the gate of MOS FET 19 causing MOS FET 19 to turn "off", thereby opening the current path which previously existed through MOS FETs 19 and 23 to $\overline{D}$.

At the same time as MOS FET 71 is turning "on", MOS FET 81 will turn "off" in response to node D charging back towards $V_{SS}$. The 0 volt source connected to the drain of MOS FET 80, which is "on" due to $\overline{LOR}$ of approximately OV impressed on its gate, will then be coupled to the gate of MOS FET 17, and current paths will exist between $V_{SS}$ and the OV connected to MOS FET 33's drain through "on" MOS FETs 21 and 17 as well as through MOS FET 1, which is "on" while MOS FET 3 is "off". The reduced current flow will be further restricted by the bootstrap circuit 22 as node D charges back and reaches its upper stable state.

Figure 4:
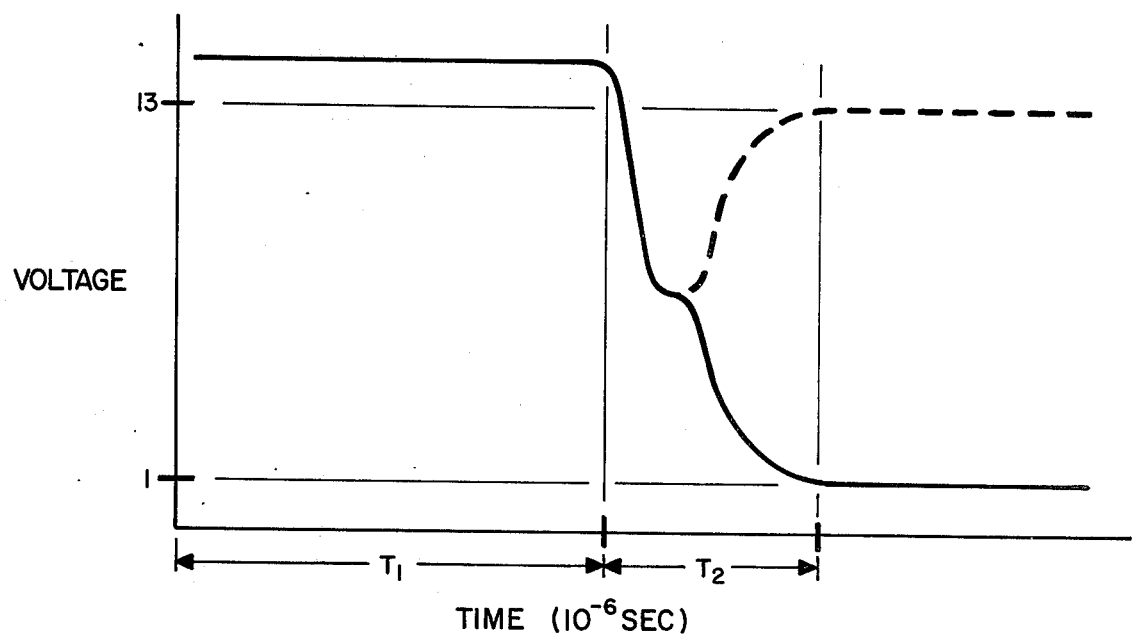
FIG. 4 is a graph of the latch outputs, D and $\overline{D}$, vs. time.

The additional cross coupling via conductors 2 and 4 and MOS FETs 70, 71, 80 and 81 makes use of the switching action of the latch 10 to reduce the total number of current paths which are active during each sense latch operation, whether it be in a read or memory retention interrogation mode, and thereby reduces the power consumption during each read cycle time TR. This reduction of current paths also results in a greater separation between the respective outputs which appear on nodes D and $\overline{D}$. Referring to FIG. 4, the latch 10 nodes D and $\overline{D}$ will switch between a low stable state of 1 volt and a high stable state of 13 volts. The increased separation occurs since fewer MOS FETs are required to sustain the latch stable states and consequently there are fewer drain-source voltage drops affecting the voltage levels to which D and $\overline{D}$ switch.

What is claimed is:

1. An improved sense latch circuit of the type coupled to an array of semiconductor memory cells and selectively operable in a read or a memory retention interrogation mode for reading binary data from said memory cells or for testing each of said memory cells to determine a plurality of analog threshold voltages peculiar to each of said memory cells with a minimum amount of disturb on the threshold voltages, said sense latch circuit comprising a bistable latch means having first and second output nodes and two stable electrical states established on said output nodes, each of said stable electrical states represented by two output potentials having a relative voltage separation therebetween for comparing two signals, at least one of said two signals functionally related to one of said plurality of threshold voltages, memory select means coupled to said memory cells and said bistable latch means for coupling said signals functionally related to said threshold voltages to said bistable latch means, reference voltage select means coupled to a reference voltage source and said bistable latch means for coupling a reference voltage to said bistable latch means and override select means coupled to said reference voltage select means and said memory select means for selectively coupling said reference voltage and said signals functionally related to said threshold voltages to said bistable latch means, wherein the improvement comprises:

transistor means coupled to said override select means and said memory select means and responsive to first and second voltages for increasing said relative voltage separation of said stable electrical states and isolating portions of said sense latch circuit as said bistable latch assumes its stable electrical states to reduce the power consumption of said sense latch circuit during its read or memory retention interrogation modes.

2. An improved sense latch circuit as set forth in claim 1 wherein said sense latch circuit is fabricated as an integrated circuit.

3. An improved sense latch circuit as set forth in claim 1 wherein said array of semiconductor memory cells is comprised of a plurality of variable threshold transistors.

4. An improved sense latch circuit as set forth in claim 3 wherein said variable threshold transistors are metal nitride oxide semiconductor field effect transistors.

5. An improved sense latch circuit as set forth in claim 1 wherein said transistor means comprises:
   a first and a second plurality of transistors respectively coupled to said first and second latch outputs, each of said plurality of transistors comprising:
   a first transistor having a gate, a source and a drain electrode said source of said first transistor coupled to a third voltage, said drain of said transistor coupled to said memory select means;
   a second transistor having a gate, a source and a drain electrode said gate of said second transistor coupled to said override select means, said drain of said second transistor coupled to a fourth voltage and said source of said second transistor coupled to said drain of said first transistor.

6. An improved sense latch circuit as set forth in claim 5 including means for deriving said first and second voltages from said stable electrical states of said bistable latch means during said read or memory retention interrogation modes.

7. An improved sense latch circuit as set forth in claim 6 wherein said array of semiconductor memory cells is comprised of a plurality of metal nitride oxide semiconductor field effect transistors.

* * * * *